US011704252B2

(12) United States Patent
Cariello et al.

(10) Patent No.: US 11,704,252 B2
(45) Date of Patent: *Jul. 18, 2023

(54) DUAL ADDRESS ENCODING FOR LOGICAL-TO-PHYSICAL MAPPING

(71) Applicant: Micron Technology, Inc., Boise, ID (US)

(72) Inventors: Giuseppe Cariello, Boise, ID (US); Jonathan S. Parry, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 2 days.

This patent is subject to a terminal disclaimer.

(21) Appl. No.: 17/495,410

(22) Filed: Oct. 6, 2021

(65) Prior Publication Data

US 2022/0100674 A1   Mar. 31, 2022

Related U.S. Application Data

(63) Continuation of application No. 16/869,397, filed on May 7, 2020, now Pat. No. 11,144,471.

(51) Int. Cl.
*G11C 8/00* (2006.01)
*G06F 12/10* (2016.01)
(Continued)

(52) U.S. Cl.
CPC .......... *G06F 12/10* (2013.01); *G11C 16/0483* (2013.01); *G11C 16/10* (2013.01);
(Continued)

(58) Field of Classification Search
CPC ......... G11C 8/12; G11C 7/1021; G11C 16/10; G11C 7/1006; G11C 8/10
(Continued)

(56) References Cited

U.S. PATENT DOCUMENTS 10,553,278 B1   2/2020 Narsale et al.
10,733,232 B2 * 8/2020 Lee ................... G11C 7/22
(Continued)

FOREIGN PATENT DOCUMENTS

CN   101030167 A   9/2007
CN   107066393 A   8/2017
EP     0090219 A2  10/1983

OTHER PUBLICATIONS

Chinese Patent Office, "Office Action and Search Report", issued in connection with Chinese Patent Application No. 202110473202.8, dated Mar. 23, 2022 (8 pages).

*Primary Examiner* — Son T Dinh
(74) *Attorney, Agent, or Firm* — Holland & Hart LLP

(57) ABSTRACT

Methods, systems, and devices for dual address encoding for logical-to-physical mapping are described. A memory device may identify a first physical address corresponding to a first logical block address generated by a host device and a second physical address corresponding to a second (consecutive) logical block address generated by a host device. The memory device may store the first physical address and second physical address in a single entry of a logical-to-physical mapping table that corresponds to the first logical block address. The memory device may transmit the logical-to-physical table to the host device for storage at the host device. The host device may subsequently transmit a single read command to the memory device that includes the first physical address and the second physical address based on the logical-to-physical table.

20 Claims, 8 Drawing Sheets

(51) Int. Cl.
*G11C 16/04* (2006.01)
*G11C 16/26* (2006.01)
*G11C 16/10* (2006.01)

(52) U.S. Cl.
CPC ........ *G11C 16/26* (2013.01); *G06F 2212/657* (2013.01); *G11C 2216/14* (2013.01)

(58) Field of Classification Search
USPC ...................................................... 365/238.5
See application file for complete search history.

(56) References Cited

U.S. PATENT DOCUMENTS

| | | | |
|---|---|---|---|
| 11,144,471 B1* | 10/2021 | Cariello | ................. G06F 12/10 |
| 2018/0121121 A1* | 5/2018 | Mehra | ................. G06F 12/0246 |
| 2019/0012227 A1 | 1/2019 | Kim et al. | |

* cited by examiner

| Byte 0-3 (P0) | Byte 4-7 (P1) |
|---|---|
| PhyAdd of LBA 0 | PhyAdd of LBA 1 |
| PhyAdd of LBA 1 | PhyAdd of LBA 2 |
| PhyAdd of LBA 2 | PhyAdd of LBA 3 |
| PhyAdd of LBA 3 | PhyAdd of LBA 4 |
| PhyAdd of LBA 4 | PhyAdd of LBA 5 |
| ... | ... |
| ... | ... |
| ... | ... |
| PhyAdd of LBA 1020 | PhyAdd of LBA 1021 |
| PhyAdd of LBA 1021 | PhyAdd of LBA 1022 |
| PhyAdd of LBA 1022 | PhyAdd of LBA 1023 |
| PhyAdd of LBA 1023 | Dummy |

FIG. 4

DUAL ADDRESS ENCODING FOR LOGICAL-TO-PHYSICAL MAPPING

CROSS REFERENCE

The present application for patent is a continuation of U.S. patent application Ser. No. 16/869,397 by Cariello et al., entitled "DUAL ADDRESS ENCODING FOR LOGICAL-TO-PHYSICAL MAPPING," filed May 7, 2020, assigned to the assignee hereof, and is expressly incorporated by reference in its entirety herein.

BACKGROUND

The following relates generally to one or more memory systems and more specifically to dual address encoding for logical-to-physical mapping.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. To access the stored information, a component may read, or sense, at least one stored state in the memory device. To store information, a component may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D Xpoint), Flash memory (such as floating-gate Flash and charge-trapping Flash, which may be used in not-or (NOR) or not-and (NAND) memory devices), and others. Memory devices may be volatile or non-volatile. Non-volatile memory cells, such as flash memory cells, may maintain their stored logic state for extended periods of time even in the absence of an external power source. Volatile memory cells, such as DRAM cells, may lose their stored state over time unless they are periodically refreshed by an external power source. Flash-based memory devices may have different performance compared to other non-volatile and volatile memory devices.

BRIEF DESCRIPTION OF THE DRAWINGS

FIG. 4 illustrates an example of a set of entries that supports dual address encoding for logical-to-physical mapping in accordance with examples as disclosed herein.

DETAILED DESCRIPTION

Figure 1:
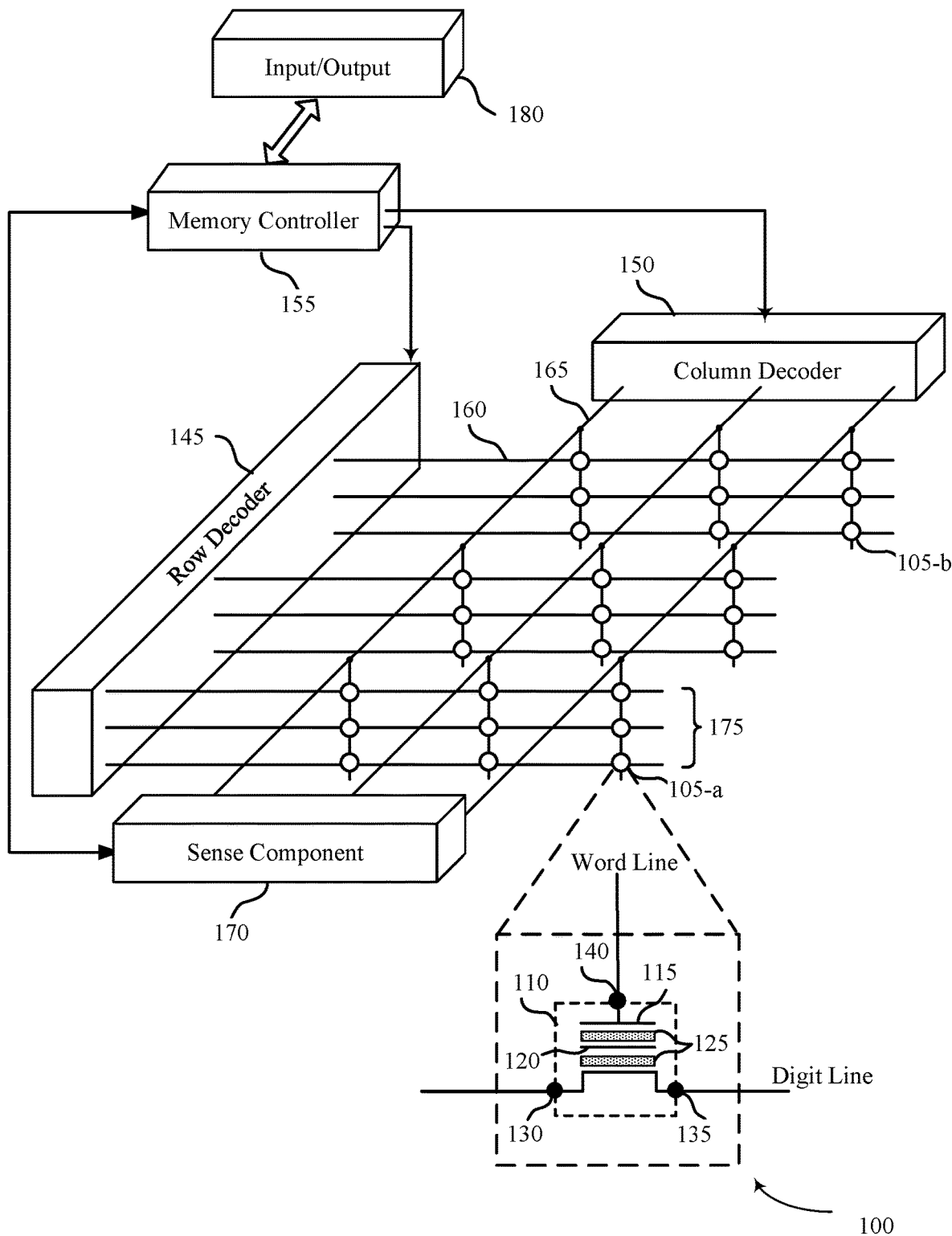
FIG. 1 illustrates an example of a memory device that supports dual address encoding for logical-to-physical mapping in accordance with examples as disclosed herein.

Flash memory is generally organized into pages and blocks, with each block containing multiple pages. Flash memory cells may be read and written at the page level of granularity but may be erased at a block level of granularity. In some cases, Flash memory cells may be erased before they can be re-written with new data. Thus, when a Flash memory device updates a page of data (e.g., in response to a command from a host device), the memory device may write the new data to a different page and mark the old page as obsolete, rather than erasing a block of memory and re-writing the pages in the block.

A memory device may receive commands, such as read and write commands for reading or writing data, from a host device. For a write operation, the host device may refer to the location of data stored in the memory device using a logical block address (LBA) that is mapped to a physical address of a page of memory of the memory device at which the data is stored. Because the physical address of the data may change (e.g., when data is updated by writing the updated data to a different page), some memory devices maintain one or more logical-to-physical (L2P) tables that map LBAs generated by the host device to corresponding physical addresses of pages in the memory device. In this manner, the host device can request to read data from the memory device using the same LBA even if the data has been moved to a different physical address of the memory device.

In some cases, each entry in an L2P table may contain a single physical address that points to a page of data stored in the memory device. Because L2P entries may be frequently updated as data is written, over-written, moved, etc., L2P tables are often stored in DRAM or other memory component associated with the Flash memory, which supports relatively fast reads and writes.

For memory devices with large memory capacities, however, L2P tables may be too big to store on the memory device itself. Moreover, some storage devices, such as Universal Flash Storage (UFS) devices, may lack on-chip DRAM for storing and updating L2P tables. Thus, some memory devices may use memory that resides on the host device (e.g., host DRAM) to store the L2P mapping tables rather than storing such tables locally. In such cases, during a read operation, the host device may generate the LBA and look up the corresponding physical address in the L2P table, then include the physical address in the read command to the memory device (e.g., rather than the memory device looking up the physical address based on an LBA received in a command from the host device).

In some cases, each entry in an L2P table may include a single physical address that points to a single page of memory. Thus, reading more than one page of data may use multiple accesses of the L2P table to retrieve multiple physical addresses, thereby potentially increasing the read latency. In some cases, a host device may read multiple pages of logically consecutive data—that is, data that is stored for consecutive LBAs (but not necessarily at consecutive physical addresses). For example, analysis of cell phone data usage indicates that roughly 50% of random read traffic consists of single-page reads, with the remaining 50% consisting of multi-page reads.

As described herein, to reduce the latency associated with reading multiple pages of data, the memory device may encode (e.g., pack, store) multiple physical addresses corresponding to multiple consecutive LBAs into a single entry of an L2P table. The host may retrieve such an entry of the L2P table based on the first LBA of the entry, and may include the multiple physical addresses (which may be non-consecutive physical addresses) of the single entry in a single read command that is sent to the memory device. The host device may also include an indication of a data transfer size (e.g., a quantity of pages or bytes to be read from the memory device) in the read command to indicate, to the memory device, how many physical addresses are included in the read command. Based on receiving the read command, the memory device may read the data from the multiple physical addresses and transmit the data to the host device.

To enable access of each individual LBA and corresponding physical address in the L2P table, in some cases, a memory device may, when generating an L2P table, duplicate physical addresses in separate entries of the L2P table. For example, a first entry of an L2P table may include a first physical address corresponding to LBA 1 and a second physical address corresponding to LBA 2. A second entry of the L2P table may include (e.g., duplicate) the second physical address corresponding to LBA 2 and a third physical address corresponding to LBA 3. In this manner, the host device may be able to access each LBA individually, while also being able to retrieve two (or more) physical addresses from a single entry. In some cases, such an L2P table may also include L2P entries that contain a single physical address, thereby maintaining backwards compatibility with earlier systems.

Figure 6:
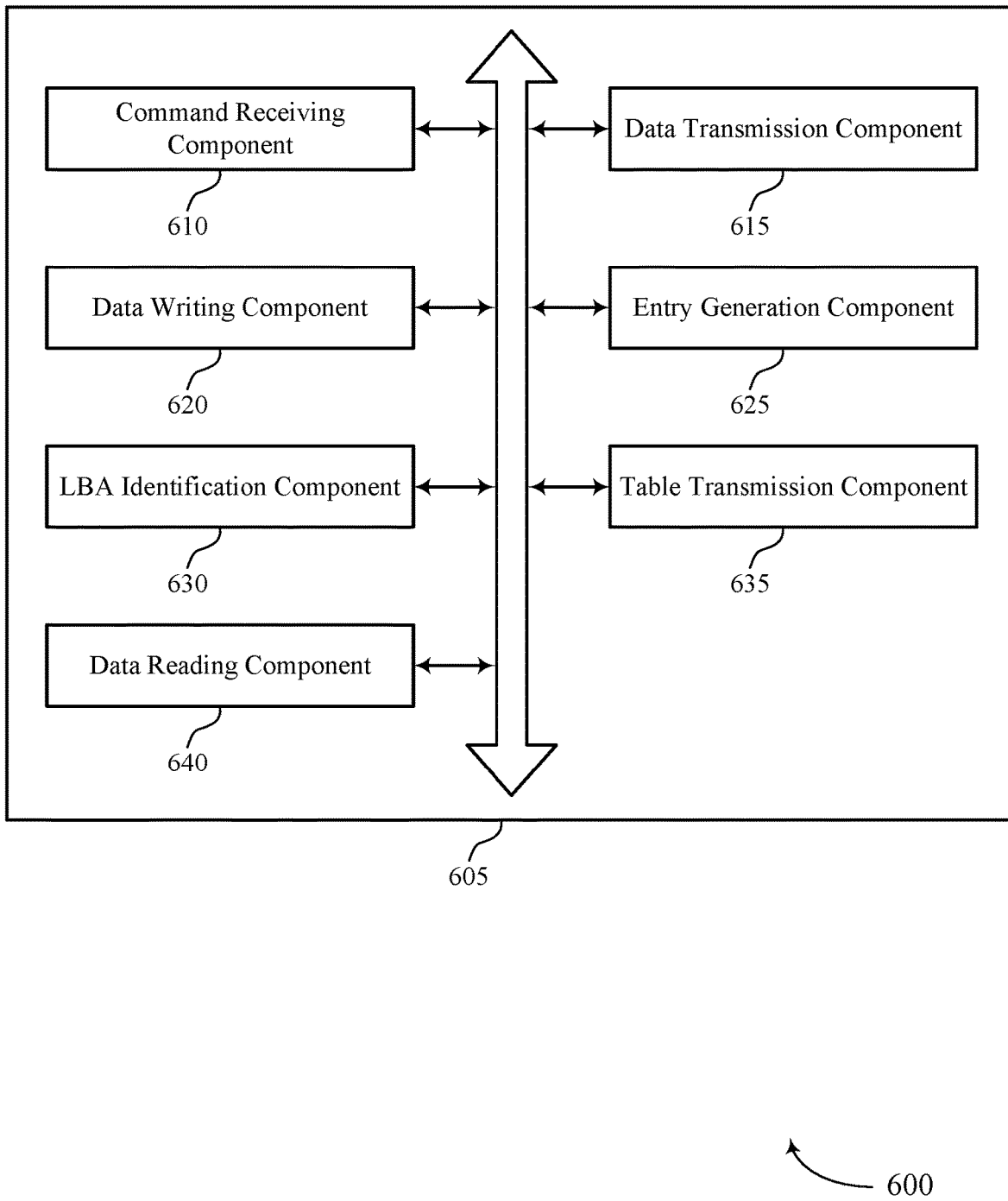
FIG. 6 shows a block diagram of a memory device that supports dual address encoding for logical-to-physical mapping in accordance with examples as disclosed herein.
Figure 7:
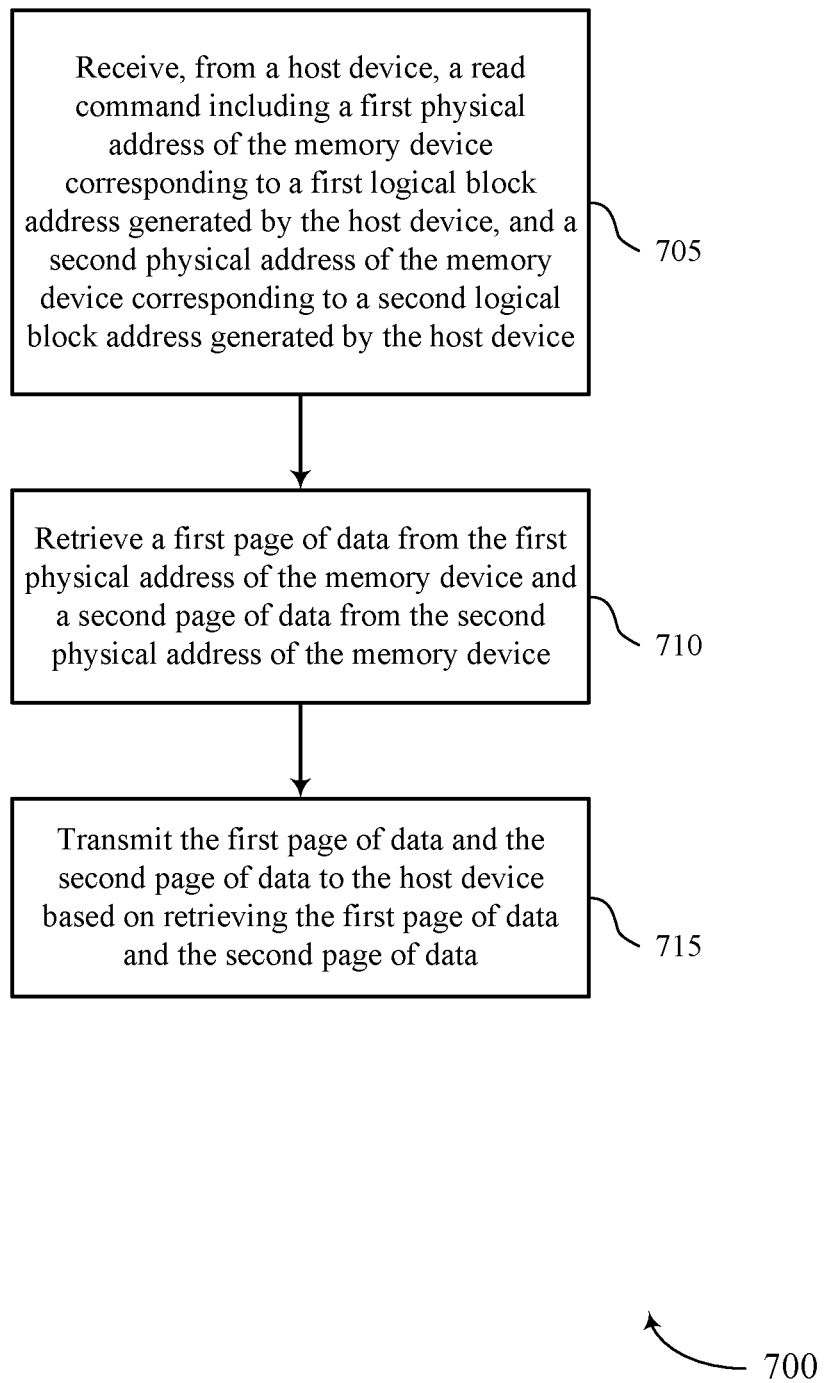
FIGS. 7 and 8 show flowcharts illustrating a method or methods that support dual address encoding for logical-to-physical mapping in accordance with examples as disclosed herein.
Figure 8:
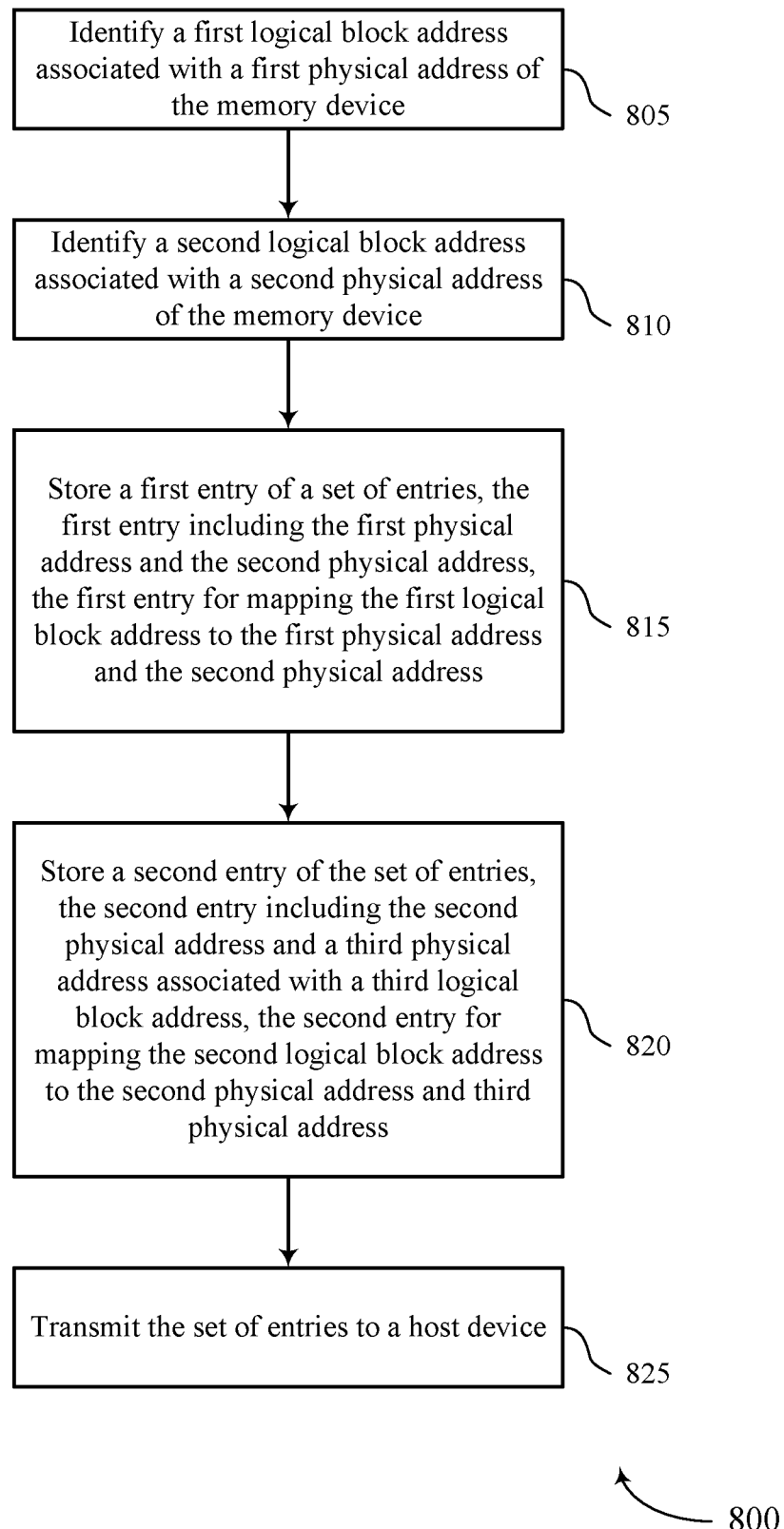

Features of the disclosure are initially described in the context of a memory device and NAND circuit as described with reference to FIGS. 1 and 2. Features of the disclosure are further described in the context of systems, sets of entries for dual-encoded L2P tables, and algorithms for generating dual-encoded L2P tables, as described with reference to FIGS. 3-5. These and other features of the disclosure are further illustrated by and described with reference to an apparatus diagram and flowcharts that relate to dual address encoding for L2P mapping as described with reference to FIGS. 6-8.

FIG. 1 illustrates an example of a memory die 100 in accordance with examples as disclosed herein. In some cases, the memory die 100 may be referred to as a universal flash storage (UFS) device, a solid-state storage device, a managed memory device, a memory chip, or an electronic memory apparatus. The memory die 100 may include one or more memory cells, such as memory cell 105-a and memory cell 105-b (other memory cells are unlabeled). A memory cell 105 may be, for example, a Flash memory cell (such as depicted in the blow-up diagram of memory cell 105-a shown in FIG. 1), a DRAM memory cell, an FeRAM memory cell, a PCM memory cell, or another type of memory cell.

Each memory cell 105 may be programmed to store a logic state representing one or more bits of information. Different memory cell architectures may store a logic state in different ways. In FeRAM architectures, for example, each memory cell 105 may include a capacitor that includes a ferroelectric material to store a charge and/or a polarization representative of the programmable state. In DRAM architectures, each memory cell 105 may include a capacitor that includes a dielectric material (e.g., an insulator) to store a charge representative of the programmable state. In Flash memory architectures, each memory cell 105 may include a transistor that has a floating gate and/or a dielectric material for storing a charge representative of the logic state. For example, the blow-up diagram of memory cell 105-a is a Flash memory cell that includes a transistor 110 (e.g., a metal-oxide-semiconductor (MOS) transistor) that may be used to store a logic state. The transistor 110 has a control gate 115 and may include a floating gate 120 that is sandwiched between dielectric material 125. Transistor 110 includes a first node 130 (e.g., a source or drain) and a second node 135 (e.g., a drain or source). A logic state may be stored in transistor 110 by placing (e.g., writing, storing) a quantity of electrons (e.g., a charge) on floating gate 120. The amount of charge to be stored on the floating gate 120 may depend on the logic state to be stored. The charge stored on floating gate 120 may affect the threshold voltage of transistor 110, thereby affecting the amount of current that may flow through transistor 110 when transistor 110 is activated. The logic state stored in transistor 110 may be read by applying a voltage to the control gate 115 (e.g., at control node 140) to activate transistor 110 and measuring (e.g., detecting, sensing) the resulting amount of current that flows between the first node 130 and the second node 135.

For example, a sense component 170 may determine a logic state stored on a Flash memory cell based on the presence or absence of a current from the memory cell, or based on whether the current is above or below a threshold current. Similarly, a Flash memory cell may be written by applying a voltage (e.g., a voltage above a threshold or a voltage below a threshold) to the memory cell to store (or not store) an electric charge on the floating gate representing one of the possible logic states.

A charge-trapping Flash memory cell may operate in a manner similar to that of a floating-gate Flash memory cell, but instead of (or in addition to) storing a charge on a floating gate 120, a charge-trapping Flash memory cell may store a charge representing the state in a dielectric material below the control gate 115. Thus, a charge-trapping Flash memory cell may or may not include a floating gate 120.

In some examples, each row of memory cells 105 is connected to a word line 160 and each column of memory cells 105 is connected to a digit line 165. Thus, one memory cell 105 may be located at the intersection of a word line 160 and a digit line 165. This intersection may be referred to as a memory cell's address. Digit lines are sometimes referred to as bit lines. In some cases, word lines 160 and digit lines 165 may be substantially perpendicular to one another and may create an array of memory cells 105 (e.g., in a memory array). In some cases, word lines 160 and digit lines 165 may be generically referred to as access lines or select lines.

In some cases, memory die 100 may include a three-dimensional (3D) memory array, where multiple two-dimensional (1D) memory arrays are formed on top of one another. This may increase the quantity of memory cells that may be placed or created on a single die or substrate as compared with 1D arrays, which in turn may reduce production costs, or increase the performance of the memory array, or both. In the example of FIG. 1, memory die 100 includes multiple levels of memory arrays. The levels may, in some examples, be separated by an electrically insulating material. Each level may be aligned or positioned so that memory cells 105 may be aligned (exactly, overlapping, or approximately) with one another across each level, forming memory cell stack 175. In some cases, memory cell stack 175 may be referred to as a string of memory cells, discussed in more detail with reference to FIG. 3.

Accessing memory cells 105 may be controlled through row decoder 145 and column decoder 150. For example, row decoder 145 may receive a row address from memory controller 155 and activate an appropriate word line 160 based on the received row address. Similarly, column decoder 150 may receive a column address from memory controller 155 and activate an appropriate digit line 165. Thus, by activating one word line 160 and one digit line 165, one memory cell 105 may be accessed.

Upon accessing, memory cell 105 may be read, or sensed, by sense component 170. For example, sense component 170 may be configured to determine the stored logic state of memory cell 105 based on a signal generated by accessing memory cell 105. The signal may include a voltage or electrical current, or both, and sense component 170 may include voltage sense amplifiers, current sense amplifiers, or both. For example, a current or voltage may be applied to a memory cell 105 (using the corresponding word line 160 and/or digit line 165) and the magnitude of the resulting current or voltage on the digit line 165 may depend on the logic state stored by the memory cell 105. For example, for a Flash memory cell, the amount of charge stored on a floating gate or in an insulating layer of a transistor in the memory cell 105 may affect the threshold voltage of the transistor, thereby affecting the amount of current that flows through the transistor in the memory cell 105 when the memory cell 105 is accessed. Such differences in current may be used to determine the logic state stored on the memory cell 105.

Sense component 170 may include various transistors or amplifiers in order to detect and amplify a signal (e.g., a current or voltage) on a digit line 165. The detected logic state of memory cell 105 may then be output via input/output block 180. In some cases, sense component 170 may be a part of column decoder 150 or row decoder 145, or sense component 170 may otherwise be connected to or in electronic communication with column decoder 150 or row decoder 145.

A memory cell 105 may be set or written by similarly activating the relevant word line 160 and digit line 165 to enable a logic state (e.g., representing one or more bits of information) to be stored in the memory cell 105. Column decoder 150 or row decoder 145 may accept data, for example from input/output block 180, to be written to the memory cells 105. As previously discussed, in the case of Flash memory (such as Flash memory used in NAND and 3D NAND memory devices) a memory cell 105 may be written by storing electrons in a floating gate or an insulating layer.

Memory controller 155 may control the operation (e.g., read, write, re-write, refresh, verify, erase) of memory cells 105 through the various components, for example, row decoder 145, column decoder 150, and sense component 170. In some cases, one or more of row decoder 145, column decoder 150, and sense component 170 may be co-located with memory controller 155. Memory controller 155 may generate row and column address signals in order to activate the desired word line 160 and digit line 165. Memory controller 155 may also generate and control various voltages or currents used during the operation of memory die 100.

In some cases, memory controller 155 or another electronic component of memory die 100 may construct (e.g., build, generate, and/or maintain) one or more L2P tables for mapping LBAs generated by a host device to physical addresses in the memory die 100 (e.g., addresses of physical pages in memory die 100 that correspond to the LBAs).

Memory die 100 may transmit such L2P tables to the host device, and the host device may store the L2P tables for subsequent look-up access for read operations.

In some cases, memory die 100 may receive a read command from the host device that includes one or more physical addresses and an indication of a data transfer length. Memory die 100 may extract the physical addresses from the read command and may retrieve data from the multiple physical addresses based on the read command. Memory die 100 may transmit the retrieved data to the host device.

Figure 2:
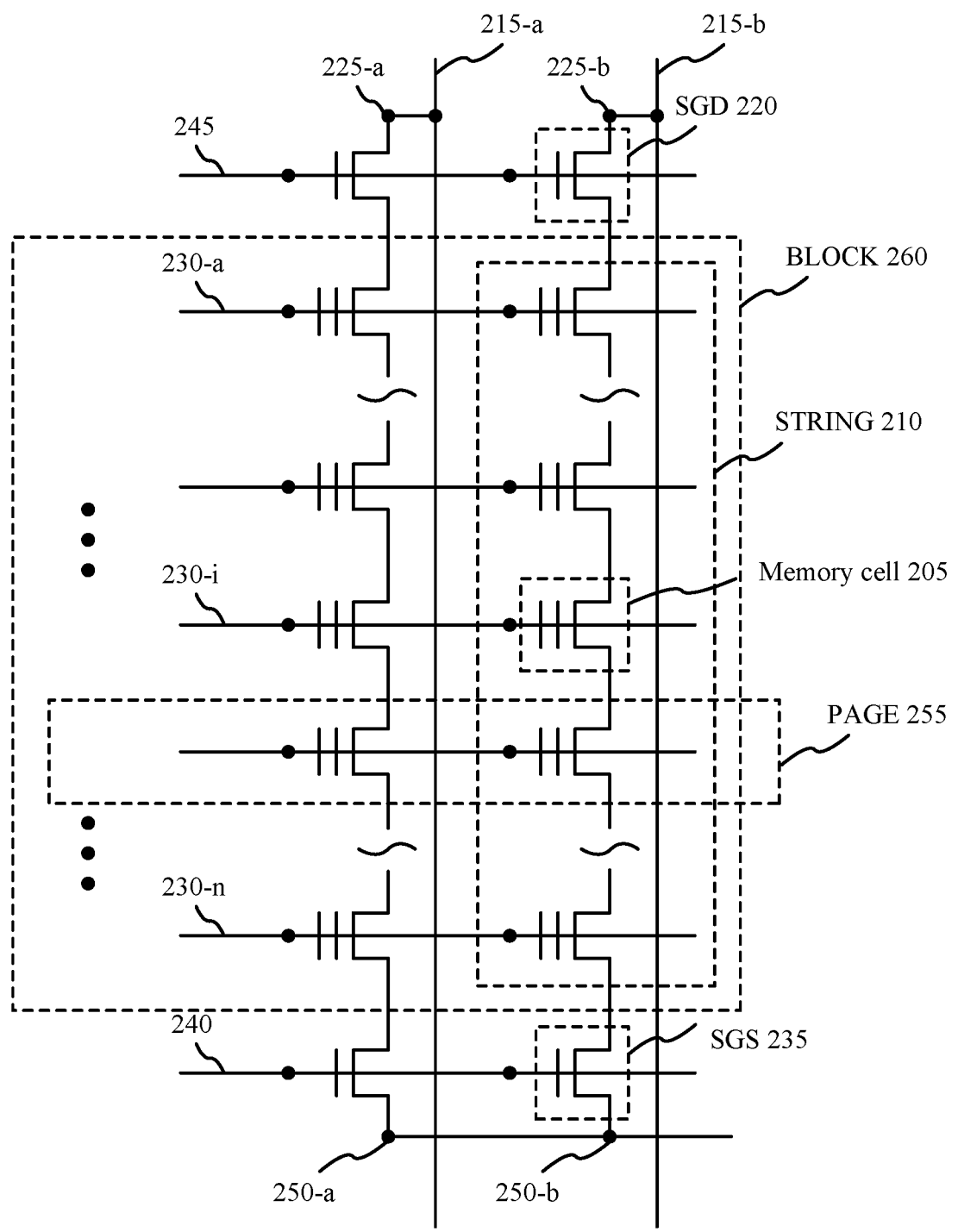
FIG. 2 illustrates an example of a NAND circuit that supports dual address encoding for logical-to-physical mapping in accordance with examples as disclosed herein.

FIG. 2 illustrates an example of NAND circuit 200 that supports dual address encoding for logical-to-physical mapping in accordance with examples of the present disclosure. NAND circuit 200 may be an example of a portion of a memory device, such as memory die 100. Although some elements included in FIG. 2 are labeled with reference numbers, other corresponding elements are not labeled, though they are the same or would be understood to be similar, in an effort to increase visibility and clarity of the depicted features.

NAND circuit 200 includes multiple Flash memory cells 205 (which may be, for example, Flash memory cells such as described with reference to FIG. 1) connected in a NAND configuration. In a NAND memory configuration (referred to as NAND memory), multiple Flash memory cells 205 are connected in series with each other to form strings 210 of memory cells 205, in which the drain of each Flash memory cell 205 in the string 210 is coupled with the source of another Flash memory cell 205 in the string. In some cases, Flash memory cells that are connected in a NAND configuration to form a NAND memory may be referred to as NAND memory cells.

Each string 210 of memory cells 205 may be associated with a corresponding digit line 215 (e.g., digit line 215-a, 215-b) that is shared by the memory cells 205 in the string 210. Each memory cell 205 in a string 210 may be associated with a separate word line 230 (e.g., word line 230-a, 230-i, 230-n), such that the quantity of word lines 230 may be equal to the quantity of memory cells 205 in a string 210.

NAND memory may be hierarchically organized as strings 210 that include multiple memory cells 205, pages 255 that include memory cells 205 that are connected to the same word line 230 (e.g., memory cells 205 from multiple strings 210), and blocks 260 that include multiple pages 255. A NAND memory cell may be erased before it can be re-written. In some cases, NAND memory can be written to and read from at the page level of granularity (e.g., by activating the corresponding word line 230), but may not be erasable at the page level of granularity. In some cases, NAND memory may instead be erasable at a higher level of granularity, such as at the block level of granularity. Different memory devices may have different read/write/erase characteristics.

Each string 210 of memory cells 205 in NAND circuit 200 is coupled with a select gate device for drain (SGD) transistor 220 at one end of the string 210 and a select gate device for source (SGS) transistor 235 at the other end of the string 210. SGD transistor 220 and SGS transistor 235 may be used to couple a string 210 of memory cells 205 to a digit line 215 and/or to a source node 250 (e.g., source node 250-a, 250-b) by applying a voltage at the gate 245 of SGD transistor 220 and/or at the gate 240 of SGS transistor 235, respectively.

During NAND memory operations, various voltage levels associated with source node 250, gate 240 of an SGS transistor 235 associated with source node 250, word lines 230, drain node 225, gate 245 of an SGD transistor 220 associated with drain node 225, and digit line 215 may be applied to perform one or more operations (e.g., program, erase, or read) on at least some NAND memory cells in a string 210.

In some cases, during a read operation, a positive voltage may be applied to digit line 215 connected to drain node 225 whereas source node 250 may be connected to a ground or a virtual ground (e.g., approximately 0 V). For example, the voltage applied to drain node 225 may be 1 V. Concurrently, voltages applied to gates 245 and 240 may be increased above the threshold voltages of the one or more SGSs 235 associated with source node 250 and the one or more SGDs 220 associated with drain node 225, such that a channel associated with string 210 may be electrically connected to drain node 225 and source node 250. A channel may be an electrical path through the memory cells 205 in a string 210 (e.g., through the transistors in the memory cells 205) that may conduct current under certain operating conditions.

Concurrently, multiple word lines 230 (e.g., word lines 230-a, 230-i, 230-n, or in some cases all word lines 230) except a selected word line (i.e., word lines associated with unselected cells in string 210) may be connected to a voltage (e.g., VREAD) that is higher than the highest threshold voltage (VT) of memory cells in string 210. VREAD may cause some or all of the unselected memory cells in string 210 to turn "ON" so that each unselected memory cell can maintain high conductivity in a channel associated with it. In some examples, a word line 230 associated with a selected cell may be connected to a voltage, VTarget. VTarget may be selected at a value between VT of an erased memory cell and VT of a programmed memory cell in string 210. When the selected memory cell exhibits an erased VT (e.g., VTarget>VT of the selected memory cell), the selected memory cell 205 may turn "ON" in response to the application of VTarget and thus allow a current to flow in the channel of string 210 from digit line 215 to source 250. When the selected memory cell exhibits a programmed VT (e.g., hence VTarget<VT of the selected memory cell), the selected memory cell may turn "OFF" in response to VTarget and thus prohibit a current to flow in the channel of string 210 from digit line 215 to source 250. The amount of current flow (or lack thereof), may be sensed by sense component 170 as described with reference to FIG. 1 to read stored information in the selected memory cell 205 within string 210.

Figure 3:
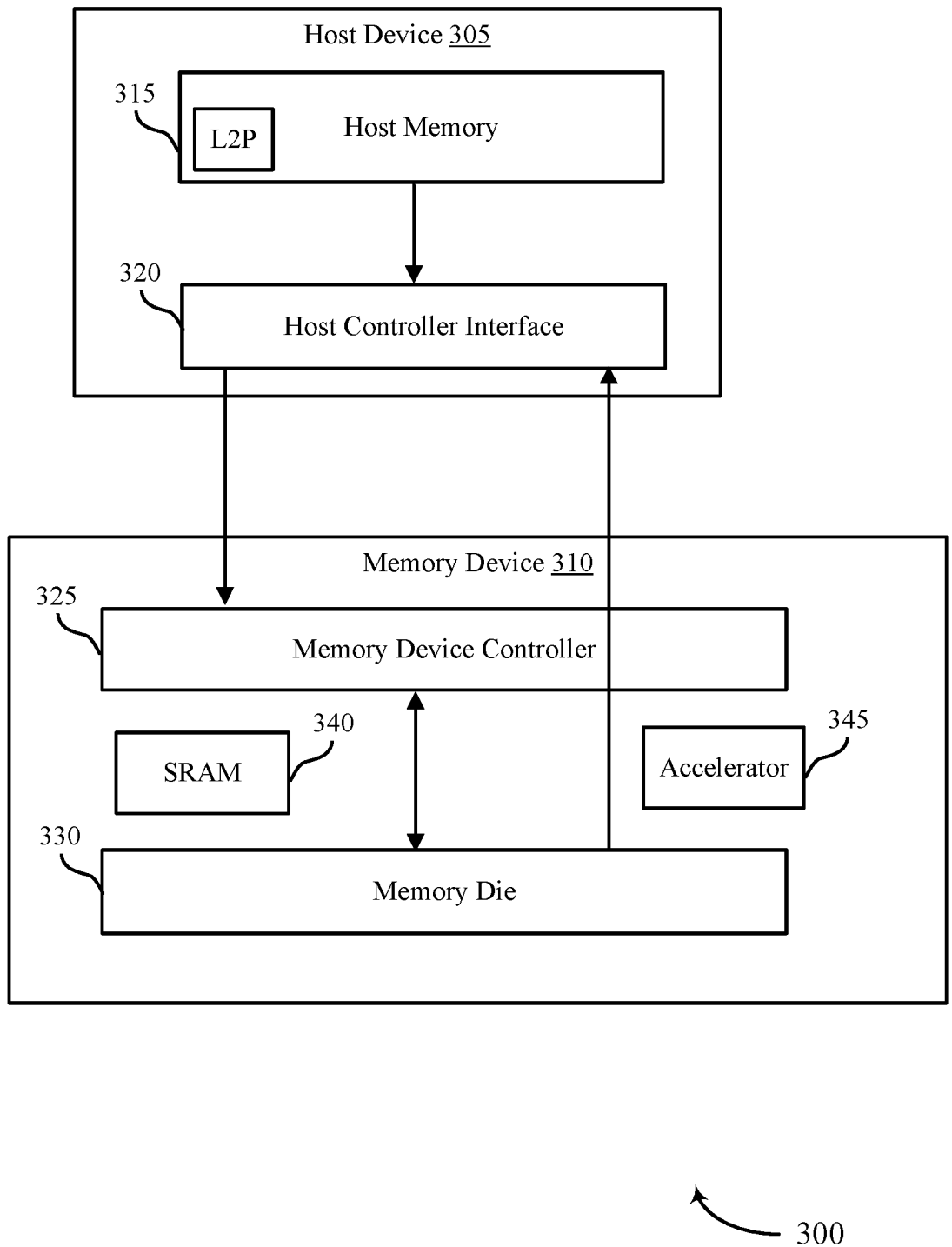
FIG. 3 illustrates an example of a system that supports dual address encoding for logical-to-physical mapping in accordance with examples as disclosed herein.

FIG. 3 is an example of a system 300 that supports dual address encoding for logical-to-physical mapping in accordance with examples of the present disclosure. The system 300 includes a host device 305 coupled with a memory device 310.

Memory device 310 may be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

Host device 305 may use memory device 310 to store data in memory arrays 330 and read data from memory arrays 330. Host device 305 may be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes a memory and a processing device. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc.

Memory device 310 may include a memory device controller 325 and one or more memory die 330 for storing data. In some examples, memory device controller 325 may be included in a controller die that may be separate (e.g., distinct) from memory die 330 and may be packaged together with memory die 330 in a single package (e.g., a package containing memory device 310).

Memory die 330 may be an example of memory die 100 described with reference to FIG. 1 and may include NAND memory arrays, for example, or other types of memory arrays for reading and writing data for host device 305.

In some examples, each memory die 330 in memory device 310 may include a local memory controller, which may be responsible for orchestrating lower level operations, (such as activating row and column drivers) during read operations, write operations, verify operations, erase operations, or other operations that may be performed on a memory array of memory die 330, as described with reference to memory controller 155 of FIG. 1.

In some examples, memory device controller 325 may communicate with each of the local memory controllers (e.g., memory controller 155) of respective memory die 330 to direct memory die 330 to perform memory operations. Memory device controller 325 may also handle some higher-level operations of memory device 310, such as garbage collection or other operations. In some examples, the term "controller" as used herein may refer to memory device controller 325, a local memory controller 155, or a combination thereof.

In some cases, memory device 310 may also include static random access memory (SRAM) memory 340 or other types of memory that may be used by memory device 310 for internal storage or calculations, for example. Accesses to SRAM memory 340 may be faster than accesses to a memory array (e.g., a NAND memory array) in memory die 330, and therefore it may be desirable to use SRAM memory 340 for storing and updating L2P tables. In some examples, however, SRAM memory 340 may be integrated with memory device controller 325 on a single die, which may constrain the size of SRAM memory 340 (e.g., due to cost or other constraints associated with memory device controller 325). Thus, in some examples, a size of SRAM memory 340 may be smaller than a size of an L2P table used by memory device 310 and may therefore be insufficient for storing L2P mapping information. As a result, in some examples, a memory device 310 may generate L2P mapping tables and transmit them to host device 305 for storage rather than storing the L2P tables locally on memory die 330. As described in more detail with reference to FIG. 5, in some examples, SRAM memory 340 may be used, by memory device 310, for building one or more L2P tables that may be transmitted to host device 305 for storage.

Host device 305 includes host controller interface 320. Host controller interface 320 may provide an interface for passing control, address, data, and other signals between host device 305 and memory device 310. Host device 305 may transmit memory access commands, such as read or write commands, to memory device 310 using host controller interface 320.

Memory device controller 325 may receive signals from host device 305 via host controller interface 320 and may cause memory device 310 to perform certain operations in response to receiving such signals. For example, memory device controller 325 may receive a read or write command from host device 305 and, in response, may cause memory device 310 to read data or write data to memory die 330 based on the received command.

Host device 305 includes host memory 315, which may include one or more types of volatile or non-volatile memory. For example, host memory 315 may include SRAM, DRAM, Flash, or other types of memory.

In some examples, memory device 310 may build and maintain one or more sets of entries (e.g., L2P look-up tables) for mapping LBAs generated by host device 305 to physical addresses (e.g., page addresses) of memory die 330. Such sets of entries may be generated based on receiving one or more write commands from the host device 305 that include an LBA for writing data. Each entry in an L2P table may include one or more physical addresses corresponding to the one or more LBAs in the write command(s). In some cases, memory device 310 may transmit such sets of entries to host device 305 such that the sets of entries (L2P tables) are stored in host memory 315. For example, memory device controller 325 may transmit such sets of entries to host device 305 (e.g., via host controller interface 320).

The memory device 310 may include an accelerator 345 for building the sets of entries. In some cases, some or all of accelerator 345 may be a hardware accelerator configured to perform a dedicated function in memory device 310. In some cases, some or all of accelerator 345 may be implemented in hardware, software, firmware, or a combination thereof that is executed by memory device controller 325, or by a local memory controller of memory die 330, or by another component of memory device 310, or by some combination of these.

In some examples, entries in a set of entries may be ordered sequentially by an LBA index. That is, a first entry in a set of entries may correspond to LBA 0, a second (consecutive) entry in the set of entries may correspond to LBA 1, a third entry may correspond to LBA 2, and so on. In some examples, memory device 310 may encode (e.g., pack, store) two or more physical addresses (e.g., corresponding to two or more consecutive LBAs) into a single entry of the set of entries. For example, if memory device 310 receives multiple write commands from host device 305 that specify consecutive (e.g., LBAs having indices that are numerically consecutive, contiguous) LBAs, memory device 310 may determine (e.g., select, identify) multiple corresponding physical addresses at which the data will be written, and may store, in the set of entries, a single entry that contains the multiple physical addresses.

When host device 305 reads data from memory device 310, host device 305 may identify one or more LBAs of the data to be read, and may look up corresponding physical addresses in the set of entries that resides in host memory 315. Host device 305 may, based on looking up an entry in the set of entries, transmit a read command that includes the physical address(es), the LBA, and an indication of a data transfer length to memory device 310 (e.g., whether the read operation is a 4 kB read or an 8 kB read). Memory device 310 may then retrieve data at the physical address(es) specified in the read command and transmit the retrieved data to host device 305. For example, host device 305 may transmit a read command that includes a first physical address corresponding to a first LBA and a second physical address corresponding to a second (consecutive) LBA. The read command may include an indication that the data transfer length is two (e.g., two pages); e.g., that the read command includes two physical addresses for a data transfer length of two pages. The memory device 310 may retrieve a first portion of the data from the first physical address and a second portion of the data from the second physical address and transmit the first portion of the data and second portion of the data to the host device 305. The combined length of the first portion of the data and the second portion of the data may be associated with (e.g., equal to, corresponding to) the indicated data transfer length. For example, if the indicated data transfer length is two, the combined length of the first portion of the data and the second portion of the data may be two pages (e.g., 8 kB, for a memory device with 4 kB pages).

FIG. 4 illustrates an example of a set of entries 400 that supports dual address encoding for logical-to-physical mapping in accordance with examples as disclosed herein. Set of entries 400 may represent an L2P table that may be generated by a memory device (such as memory device 310) for mapping LBAs to physical addresses. In some cases, set of entries 400 may be generated by a memory device, transmitted to a host device such as host device 305 described with reference to FIG. 3, and stored in memory that resides on the host device.

In some cases, a memory device may generate set of entries 400 based on receiving multiple write commands from a host device that specify multiple consecutive LBAs (e.g., LBA 1, LBA 2, LBA 3, etc.) for writing data to the memory device. Based on receiving the write commands, the memory device may select physical addresses for writing the data, write the data to the physical addresses, and generate one or more entries in set of entries 400 that map the LBAs generated by the host device to the corresponding physical addresses at which the data is written. Entries in the set of entries 400 may be ordered by the index of the LBAs; e.g., a first entry associated with LBA 0, a second entry associated with LBA 1, etc. The physical addresses corresponding to the LBAs and stored in the set of entries 400 may not be consecutive. In some cases, a memory device may include an accelerator for building a set of entries 400 more efficiently, as described with reference to FIG. 5.

In some cases, each entry in set of entries 400 consumes eight (8) bytes, and may map each LBA to a page of physical addresses on the memory device. A page of memory may be, for example, 4 kB of memory, 8 kB, or another size. For 4 kB pages, a set of entries that includes 1024 entries (such as set of entries 400) may be used to map LBAs to physical addresses for up to 4 MB of memory. In some cases, each entry of set of entries 400 may be accessed (e.g., by a host device) based on an LBA index of a first portion of each entry.

Set of entries 400 includes first entry 410 and second entry 415, among other entries. First entry 410 includes a first portion 410-*a* that includes a first physical address corresponding to LBA 0 and a second portion 410-*b* that includes a second physical address corresponding to LBA 1. As previously noted, the first physical address and second physical address may not be consecutive, although they may be consecutive in some cases.

Second entry 415 includes a first portion 415-*a* that includes the second physical address corresponding to LBA 1 and a second portion 415-*b* that includes a third physical address corresponding to LBA 2. Thus, the physical address corresponding to LBA 1 is duplicated in second portion 410-*b* and first portion 415-*a*. More broadly, the physical addresses corresponding to LBAs 1-1023 are duplicated across entries to enable individual retrieval of each physical address based on the LBA index of the first portion of the entry.

In some cases, set of entries 400 may include entries that contain a single physical address. For example, a final entry 420 of set of entries 400 may include a single physical address, and there may be other entries in set of entries 400 that include a single physical address.

In some cases, an entry in the set of entries may encode additional information (e.g., in addition to the one or more physical addresses). For example, an entry may include data verification information for the one or more physical addresses. For example, when the memory device generates the set of entries, the memory device may determine an error detection value (e.g., a checksum or exclusive-or (XOR) value) for the physical address(es) and store the error detection value in the entry with the physical address(es).

Although set of entries 400 depicts each entry (e.g., entries 410, 415) as including two physical addresses (corresponding to two consecutive LBAs), in some cases, a set of entries may include three or more physical addresses (corresponding to three or more consecutive LBAs).

Moreover, although set of entries 400 includes 1024 eight-byte entries that are each split into two four-byte portions, other quantities of entries, entry lengths, and/or portion lengths may be used without departing from the scope of the disclosure.

The implementation of set of entries 400 depicted in FIG. 4 may enable a host device to read data for multiple LBAs based on retrieving a single entry from set of entries 400, thereby reducing the overhead and latency associated with reading multiple blocks of data.

For example, if a host device intends to read data corresponding to LBA 1 and LBA 2, the host device may retrieve second entry 415. The host device may include the two physical addresses (e.g., a first physical address in first portion 415-a and a second physical address in second portion 415-b) in the read command, along with the first LBA (LBA1). The host device may also include, in the read command, an indication that the data transfer length is 2 (corresponding to reading data at two physical addresses). For example, a 4 kB read operation may correspond to reading a single physical address associated with a logical block address, whereas an 8 kB read operation may corresponds to reading two physical addresses with the logical block address.

A memory device may receive the read command, and may extract the first physical address (e.g., in first portion 415-a), the second physical address (e.g., in second portion 415-b), and the indication that the data transfer length is 2. The memory device may, based on the read command and the indication of the data transfer length, retrieve a first portion of the data that is stored at the first physical address and a second portion of the data that is stored at the second physical address, and may transmit the first portion of the data and the second portion of the data to the host device.

Figure 5:
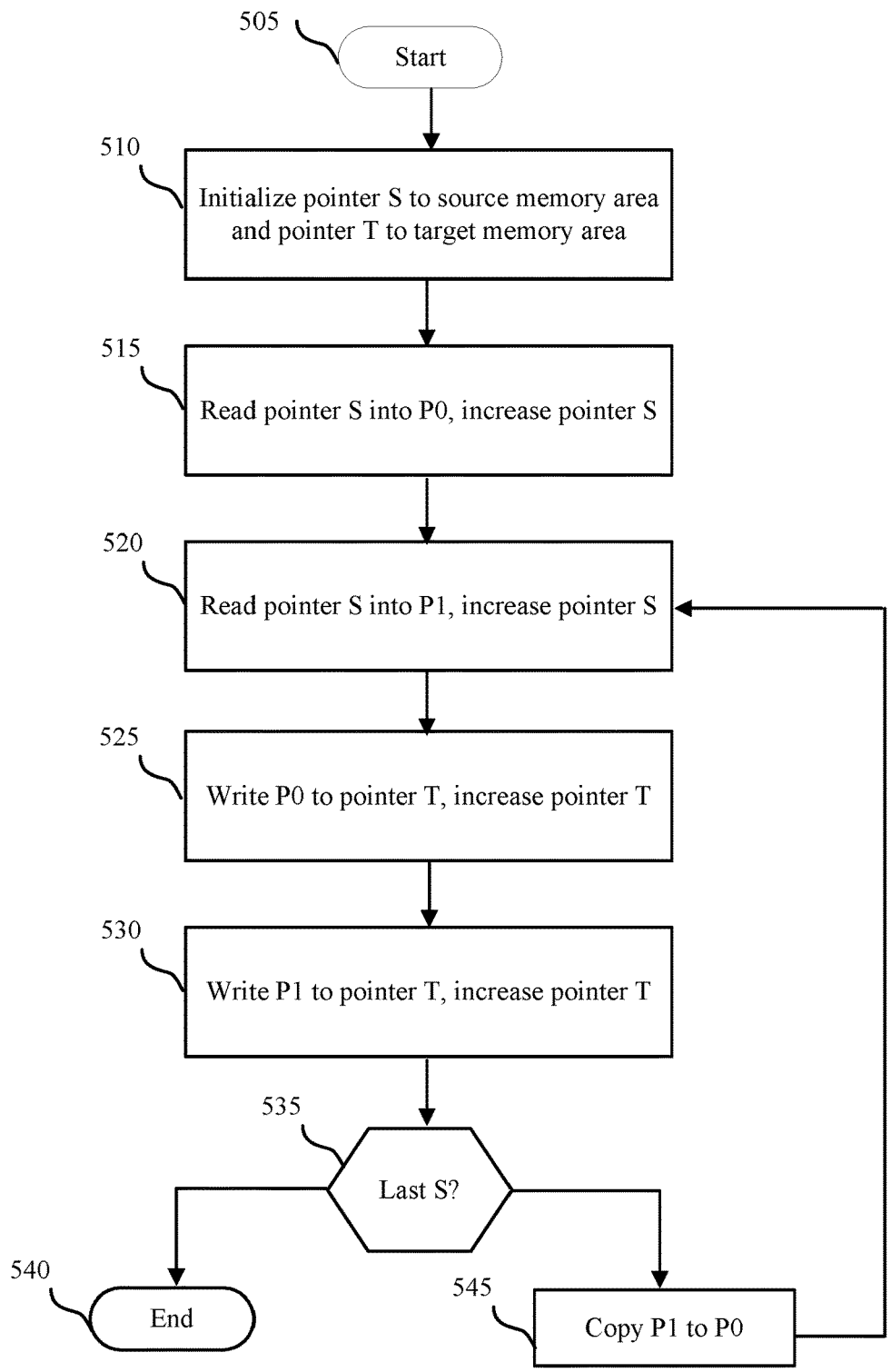
FIG. 5 illustrates an example of a process that supports dual address encoding for logical-to-physical mapping in accordance with examples as disclosed herein.

FIG. 5 illustrates an example of a process 500 that supports dual address encoding for logical-to-physical mapping in accordance with examples as disclosed herein. Process 500 may be used to efficiently build a set of entries (such as set of entries 400) for mapping LBAs to physical addresses by encoding multiple physical addresses in a single L2P entry. That is, process 500 may be used to convert an L2P table that has one physical address per entry to an L2P table that has two physical addresses per entry, as depicted in FIG. 4.

In some cases, process 500 may be implemented using a hardwired hardware accelerator, such as accelerator 345 depicted in FIG. 3. In some cases, process 500 may be implemented using firmware or software. In the description below, process 500 is described as being implemented by an accelerator; such description should not be interpreted as limiting.

At 505, an accelerator of a memory device (such as accelerator 345) may begin to build a set of entries (e.g., an L2P table) that encodes multiple physical addresses in one or more entries of the set of entries for mapping LBAs generated by a host device to physical addresses of a memory device.

At 510, the accelerator may initialize a first pointer to a first value, where the first pointer points to a location of a source memory area. The accelerator may initialize a second pointer to a first value, where the second pointer points to a location of a target memory area. In some cases, the source memory area may contain a previously generated L2P table having a single physical address in each entry. The source memory area may include one zone of SRAM memory on a memory device (such as one zone of SRAM 340) and the target memory area may include another zone of SRAM memory on the memory device (such as another zone of SRAM 340).

At 515, the accelerator may read the value of the first pointer S (e.g., a first physical address) and save this value in a first portion (P0) of a first entry of a set of entries, such as first portion 410-a described with reference to FIG. 4. The accelerator may increase the value of the first pointer S from the first value to a second value, such as by incrementing the first pointer S.

At 520, the accelerator may read the (incremented) value of the first pointer S (e.g., a second physical address) and save this value in a second portion (P1) of an entry of a set of entries, such as second portion 410-b described with reference to FIG. 4. The accelerator may again increment the first pointer S.

At 525, the accelerator may write the value of the first portion (P0) of the first entry at a memory location in the target memory indicated by second pointer T. The accelerator may increase the value of the second pointer T from the first value to a second value, such as by incrementing the second pointer T.

At 530, the accelerator may write the value of the second portion (P1) of the first entry at a memory location in the target memory indicated by the (incremented) second pointer T. The accelerator may again increment the second pointer T.

At 535, the accelerator may determine whether some or all of the entries stored in the source memory have been read into P0 or P1; e.g., whether the original L2P table has been fully converted to a dual-encoded L2P table.

In response to determining that all of the entries have been read into P0 or P1, at 540, the accelerator may cease processing. In some cases, the accelerator may cease processing based on the quantity of entries created satisfying a threshold. The memory device may then transmit the dual-encoded set of entries to a host device for storing in memory on the host device.

In response to determining that some or all of the entries have not been read into P0 or P1, at 545, the accelerator may write the value of the second portion (P1) of the entry to the first portion (P0) of the next entry (e.g., duplicating the physical address in the first portion of the next entry of the L2P table), and continue to the next entry of the source memory table. In some cases, the accelerator may continue processing based on the quantity of entries created not satisfying a threshold.

FIG. 1 shows a block diagram 100 of a memory device 105 that supports dual address encoding for logical-to-physical mapping in accordance with examples as disclosed herein. The memory device 105 may be an example of aspects of a memory device as described with reference to FIGS. 1 through 5. The memory device 105 may include a command receiving component 110, a data transmission component 115, a data writing component 120, an entry generation component 125, an LBA identification component 130, a table transmission component 135, and a data reading component 140. Each of these modules may communicate, directly or indirectly, with one another (e.g., via one or more buses).

The command receiving component 110 may receive, from a host device, a read command including a first physical address of the memory device corresponding to a first logical block address generated by the host device and a second physical address of the memory device corresponding to a second logical block address generated by the host device. In some cases, the read command includes an indication of a data transfer length, and where a combined length of the first page of data and the second page of data is associated with the data transfer length. In some cases, the first physical address and the second physical address are contained within 8 bytes of the read command. In some cases, the read command includes the first logical block address. In some cases, the first logical block address and the second logical block address are consecutive logical block addresses. In some cases, the first physical address and the second physical address are non-consecutive physical addresses.

In some examples, the command receiving component 110 may receive, at the memory device from the host device before receiving the read command, a write command including the first logical block address, where the write command is associated with writing the first page of data to the memory device.

The data transmission component 115 may transmit the first page of data and the second page of data to the host device based on retrieving the first page of data and the second page of data.

The data transmission component 115 may transmit, to the host device before receiving the read command, a set of entries that maps a set of logical block addresses to a corresponding set of physical addresses, where a first entry in the set of entries includes the first physical address and the second physical address, and a second entry includes the second physical address and a third physical address associated with a third logical block address.

The entry generation component 125 may store a first entry of a set of entries, the first entry including the first physical address and the second physical address, the first entry for mapping the first logical block address to the first physical address and the second physical address. In some cases, each entry of the set of entries has a length of 8 bytes.

In some examples, the entry generation component 125 may store a second entry of the set of entries, the second entry including the second physical address and a third physical address associated with a third logical block address, the second entry for mapping the second logical block address to the second physical address and third physical address. In some examples, the entry generation component 125 may store, at the memory device, a first entry in a set of entries based on writing the first page of data to the memory device at the first physical address and the second page of data to the memory device at the second physical address.

In some examples, the entry generation component 125 may retrieve the first physical address from a first memory area based on a value of a first pointer. In some examples, the entry generation component 125 may store the first physical address in a first portion of the first entry.

In some examples, the entry generation component 125 may increase the value of the first pointer to a second value of the first pointer. In some examples, the entry generation component 125 may retrieve the second physical address from the first memory area based on the second value of the first pointer. In some examples, the entry generation component 125 may store the second physical address in a second portion of the first entry.

In some examples, the entry generation component 125 may store the first physical address in a second memory area based on a first value of a second pointer. In some examples, the entry generation component 125 may increase the first value of the second pointer to a second value of the second pointer.

In some examples, the entry generation component 125 may store the second physical address in the second memory area based on the second value of the second pointer, where storing the second entry includes storing the second physical address in the first portion of the second entry. In some examples, the entry generation component 125 may determine an error detection value associated with the first physical address and the second physical address, where the first entry includes the error detection value.

The LBA identification component 130 may identify a first logical block address associated with a first physical address of the memory device. In some examples, the LBA identification component 130 may identify a second logical block address associated with a second physical address of the memory device.

The table transmission component 135 may transmit the set of entries to a host device.

The data writing component 120 may write the first page of data to the memory device at the first physical address associated with the first logical block address based on the write command. In some examples, the data writing component 120 may write the second page of data to the memory device at the second physical address based on a second write command.

The data reading component 140 may retrieve a first page of data from the first physical address of the memory device and a second page of data from the second physical address of the memory device.

FIG. 2 shows a flowchart illustrating a method or methods 200 that supports dual address encoding for logical-to-physical mapping in accordance with examples as disclosed herein. The operations of method 200 may be implemented by a memory device or its components as described herein. For example, the operations of method 200 may be performed by a memory device as described with reference to FIGS. 1 through 1. In some examples, a memory device may execute a set of instructions to control the functional elements of the memory device to perform the described functions. Additionally or alternatively, a memory device may perform aspects of the described functions using special-purpose hardware.

At 205, the memory device may receive, from a host device, a read command including a first physical address of the memory device corresponding to a first logical block address generated by the host device and a second physical address of the memory device corresponding to a second logical block address generated by the host device. The operations of 205 may be performed according to the methods described herein. In some examples, aspects of the operations of 205 may be performed by a command receiving component as described with reference to FIG. 1.

At 210, the memory device may retrieve a first page of data from the first physical address of the memory device and a second page of data from the second physical address of the memory device. The operations of 210 may be performed according to the methods described herein. In some examples, aspects of the operations of 210 may be performed by a data reading component as described with reference to FIG. 1.

At 215, the memory device may transmit the first page of data and the second page of data to the host device based on retrieving the first page of data and the second page of data. The operations of 215 may be performed according to the methods described herein. In some examples, aspects of the operations of 215 may be performed by a data transmission component as described with reference to FIG. 1.

In some examples, an apparatus as described herein may perform a method or methods, such as the method 200. The apparatus may include features, means, or instructions (e.g., a non-transitory computer-readable medium storing instructions executable by a processor) for receiving, from a host device, a read command including a first physical address of the memory device corresponding to a first logical block address generated by the host device and a second physical address of the memory device corresponding to a second logical block address generated by the host device, retrieving a first page of data from the first physical address of the memory device and a second page of data from the second physical address of the memory device, and transmitting the first page of data and the second page of data to the host device based on retrieving the first page of data and the second page of data.

In some examples of the method 200 and the apparatus described herein, the read command includes an indication of a data transfer length, and a combined length of the first page of data and the second page of data may be associated with the data transfer length.

Some examples of the method 200 and the apparatus described herein may further include operations, features, means, or instructions for transmitting, to the host device before receiving the read command, a set of entries that maps a set of logical block addresses to a corresponding set of physical addresses, where a first entry in the set of entries includes the first physical address and the second physical address, and a second entry includes the second physical address and a third physical address associated with a third logical block address.

In some examples of the method 200 and the apparatus described herein, each entry of the set of entries may have a length of 8 bytes.

Some examples of the method 200 and the apparatus described herein may further include operations, features, means, or instructions for receiving, at the memory device from the host device before receiving the read command, a write command including the first logical block address, where the write command may be associated with writing the first page of data to the memory device, and writing the first page of data to the memory device at the first physical address associated with the first logical block address based on the write command.

Some examples of the method 200 and the apparatus described herein may further include operations, features, means, or instructions for storing, at the memory device, a first entry in a set of entries based on writing the first page of data to the memory device at the first physical address and writing the second page of data to the memory device at the second physical address.

In some examples of the method 200 and the apparatus described herein, the first physical address and the second physical address may be contained within 8 bytes of the read command.

In some examples of the method 200 and the apparatus described herein, the read command includes the first logical block address.

In some examples of the method 200 and the apparatus described herein, the first logical block address and the second logical block address may be consecutive logical block addresses.

In some examples of the method 200 and the apparatus described herein, the first physical address and the second physical address may be non-consecutive physical addresses.

FIG. 3 shows a flowchart illustrating a method or methods 300 that supports dual address encoding for logical-to-physical mapping in accordance with examples as disclosed herein. The operations of method 300 may be implemented by a memory device or its components as described herein. For example, the operations of method 300 may be performed by a memory device as described with reference to FIG. 1. In some examples, a memory device may execute a set of instructions to control the functional elements of the memory device to perform the described functions. Additionally or alternatively, a memory device may perform aspects of the described functions using special-purpose hardware, such as a hardware accelerator.

At 305, the memory device may identify a first logical block address associated with a first physical address of the memory device. The operations of 305 may be performed according to the methods described herein. In some examples, aspects of the operations of 305 may be performed by an LBA identification component as described with reference to FIG. 1.

At 310, the memory device may identify a second logical block address associated with a second physical address of the memory device. The operations of 310 may be performed according to the methods described herein. In some examples, aspects of the operations of 310 may be performed by an LBA identification component as described with reference to FIG. 1.

At 315, the memory device may store a first entry of a set of entries, the first entry including the first physical address and the second physical address, the first entry for mapping the first logical block address to the first physical address and the second physical address. The operations of 315 may be performed according to the methods described herein. In some examples, aspects of the operations of 315 may be performed by an entry generation component as described with reference to FIG. 1.

At 320, the memory device may store a second entry of the set of entries, the second entry including the second physical address and a third physical address associated with a third logical block address, the second entry for mapping the second logical block address to the second physical address and third physical address. The operations of 320 may be performed according to the methods described herein. In some examples, aspects of the operations of 320 may be performed by an entry generation component as described with reference to FIG. 1.

At 325, the memory device may transmit the set of entries to a host device. The operations of 325 may be performed according to the methods described herein. In some examples, aspects of the operations of 325 may be performed by a table transmission component as described with reference to FIG. 1.

In some examples, an apparatus as described herein may perform a method or methods, such as the method 300. The apparatus may include features, means, or instructions (e.g., a non-transitory computer-readable medium storing instructions executable by a processor) for identifying a first logical block address associated with a first physical address of the memory device, identifying a second logical block address associated with a second physical address of the memory device, storing a first entry of a set of entries, the first entry including the first physical address and the second physical address, the first entry for mapping the first logical block address to the first physical address and the second physical address, storing a second entry of the set of entries, the second entry including the second physical address and a third physical address associated with a third logical block address, the second entry for mapping the second logical block address to the second physical address and the third physical address, and transmitting the set of entries to a host device.

In some examples of the method 300 and the apparatus described herein, storing the first entry may include operations, features, means, or instructions for retrieving the first physical address from a first memory area based on a value of a first pointer, storing the first physical address in a first portion of the first entry, increasing the value of the first pointer to a second value of the first pointer, retrieving the second physical address from the first memory area based on the second value of the first pointer, and storing the second physical address in a second portion of the first entry.

Some examples of the method 300 and the apparatus described herein may further include operations, features, means, or instructions for storing the first physical address in a second memory area based on a first value of a second pointer, increasing the first value of the second pointer to a second value of the second pointer, and storing the second physical address in the second memory area based on the second value of the second pointer, where storing the second entry includes storing the second physical address in the first portion of the second entry.

In some examples of the method 300 and the apparatus described herein, the first portion of the first entry and the second portion of the first entry each may have a size of four bytes.

Some examples of the method 300 and the apparatus described herein may further include operations, features, means, or instructions for determining an error detection value associated with the first physical address and the second physical address, where the first entry include the error detection value.

It should be noted that the methods described herein are possible implementations, and that the operations and the steps may be rearranged or otherwise modified and that other implementations are possible. Furthermore, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a memory device; and
   an accelerator configured to generate a set of entries for mapping logical block addresses to physical addresses of the memory device, the set of entries comprising:
   a first entry for mapping a first logical block address to a first physical address and a second physical address; and
   a second entry for mapping a second logical block address to the second physical address and a third physical address.

2. The apparatus of claim 1, wherein the accelerator is configured to:
   read, based at least in part on a first value of a first pointer, the first physical address from a first portion of a first memory area of the memory device;

read, based at least in part on a second value of the first pointer, the second physical address from a second portion of the first memory area;

write, to a first portion of a second memory area of the memory device, the first physical address based at least in part on a first value of a second pointer and reading the first physical address from the first portion of the first memory area; and write, to a second portion of the second memory area, the second physical address based at least in part on a second value of the second pointer and reading the second physical address from the second portion of the first memory area, wherein the first entry comprises the first portion of the second memory area and the second portion of the second memory area.

3. The apparatus of claim 2, wherein the accelerator is configure to:

increment the first pointer from the first value of the first pointer to the second value of the first pointer between reading the first physical address and reading the second physical address; and increment the second pointer from the first value of the second pointer to the second value of the second pointer between writing the first physical address and writing the second physical address.

4. The apparatus of claim 2, wherein the accelerator is configured to:

determine that one or more additional portions of the first memory area are unread by the accelerator;

write the second physical address to a third portion of the second memory area based at least in part on the determination and a third value of the second pointer;

read the third physical address from a third portion of the first memory area based at least in part on the determination and a third value of the first pointer; and write the third physical address to a fourth portion of the second memory area based at least in part on a fourth value of the second pointer and reading the third physical address from the third portion of the first memory area, wherein the second entry comprises the third portion of the second memory area and the fourth portion of the second memory area.

5. The apparatus of claim 2, wherein:

the first memory area is configured to store a first logical-to-physical (L2P) table including entries that map a single logical block address to a single physical address; and the second memory area is configured to store a second L2P table including entries that map a single logical block address to two or more physical addresses.

6. The apparatus of claim 1, wherein the accelerator is configured to generate the set of entries from a second set of entries, each entry of the second set of entries mapping a single logical block address to a single physical address.

7. The apparatus of claim 1, wherein the memory device is configured to:

transmit the set of entries to a host device; and receive, from the host device, a read command comprising the first physical address and the second physical address corresponding to the first logical block address or comprising the second physical address and the third physical address corresponding to the second logical block address.

8. The apparatus of claim 1, wherein the accelerator is a hardware accelerator configured to perform a dedicated function comprising generating the set of entries.

9. The apparatus of claim 1, wherein the first logical block address and the second logical block address are consecutive logical block addresses, the first physical address and the second physical address are non-consecutive physical addresses, or a combination thereof.

10. An apparatus, comprising:

an array of memory cells;

an accelerator; and a controller coupled with the array of memory cells and the accelerator and configured to cause the apparatus to:

generate, using the accelerator, a first entry of a set of entries, the first entry comprising a first physical address associated with a first logical block address and a second physical address associated with a second logical block address, the first entry for mapping the first logical block address to the first physical address and the second physical address; and generate, using the accelerator, a second entry of the set of entries, the second entry comprising the second physical address and a third physical address associated with a third logical block address, the second entry for mapping the second logical block address to the second physical address and the third physical address.

11. The apparatus of claim 10, wherein the controller is further configured to cause the apparatus to:

read, based at least in part on a first value of a first pointer, the first physical address from a first portion of a first memory area of the array of memory cells;

read, based at least in part on a second value of the first pointer, the second physical address from a second portion of the first memory area;

write, to a first portion of a second memory area of the array of memory cells, the first physical address based at least in part on a first value of a second pointer and reading the first physical address from the first portion of the first memory area; and write, to a second portion of the second memory area, the second physical address based at least in part on a second value of the second pointer and reading the second physical address from the second portion of the first memory area, wherein the first entry comprises the first portion of the second memory area and the second portion of the second memory area.

12. The apparatus of claim 11, wherein the controller is further configured to cause the apparatus to:

increment the first pointer from the first value of the first pointer to the second value of the first pointer between reading the first physical address and reading the second physical address; and increment the second pointer from the first value of the second pointer to the second value of the second pointer between writing the first physical address and writing the second physical address.

13. The apparatus of claim 11, wherein the controller is further configured to cause the apparatus to:

determine that one or more additional portions of the first memory area are unread by the accelerator;

write the second physical address to a third portion of the second memory area based at least in part on the determination and a third value of the second pointer;

read the third physical address from a third portion of the first memory area based at least in part on the determination and a third value of the first pointer; and write the third physical address to a fourth portion of the second memory area based at least in part on a fourth value of the second pointer and reading the third physical address from the third portion of the first memory area, wherein the second entry comprises the third portion of the second memory area and the fourth portion of the second memory area.

14. The apparatus of claim 11, wherein:
the first memory area is configured to store a first logical-to-physical (L2P) table including entries that map a single logical block address to a single physical address; and
the second memory area is configured to store a second L2P table including entries that map a single logical block address to two or more physical addresses.

15. The apparatus of claim 10, wherein, to generate the set of entries, the controller is further configured to cause the apparatus to:
generate the set of entries from a second set of entries, each entry of the second set of entries mapping a single logical block address to a single physical address.

16. The apparatus of claim 10, wherein the controller is further configured to cause the apparatus to:
transmit the set of entries to a host device; and
receive, from the host device, a read command comprising the first physical address and the second physical address corresponding to the first logical block address or comprising the second physical address and the third physical address corresponding to the second logical block address.

17. The apparatus of claim 10, wherein the accelerator is a hardware accelerator configured to perform a dedicated function comprising generating the set of entries.

18. The apparatus of claim 10, wherein the first logical block address and the second logical block address are consecutive logical block addresses, the first physical address and the second physical address are non-consecutive physical addresses, or a combination thereof.

19. A non-transitory computer-readable medium storing code comprising instructions which, when executed by a processor of an electronic device, cause the electronic device to:
generate, using an accelerator, a first entry of a set of entries, the first entry comprising a first physical address associated with a first logical block address and a second physical address associated with a second logical block address, the first entry for mapping the first logical block address to the first physical address and the second physical address; and
generate, using the accelerator, a second entry of the set of entries, the second entry comprising the second physical address and a third physical address associated with a third logical block address, the second entry for mapping the second logical block address to the second physical address and the third physical address.

20. The non-transitory computer-readable medium of claim 19, wherein the instructions, when executed by the processor of the electronic device, further cause the electronic device to:
read, based at least in part on a first value of a first pointer, the first physical address from a first portion of a first memory area of the electronic device;
read, based at least in part on a second value of the first pointer, the second physical address from a second portion of the first memory area;
write, to a first portion of a second memory area of the electronic device, the first physical address based at least in part on a first value of a second pointer and reading the first physical address from the first portion of the first memory area; and
write, to a second portion of the second memory area, the second physical address based at least in part on a second value of the second pointer and reading the second physical address from the second portion of the first memory area, wherein the first entry comprises the first portion of the second memory area and the second portion of the second memory area.

* * * * *